United States Patent
Zhang et al.

(10) Patent No.: US 9,159,952 B2
(45) Date of Patent: Oct. 13, 2015

(54) FLEXIBLE PACKAGING SUBSTRATE AND FABRICATING METHOD THEREOF AND PACKAGING METHOD FOR OLED USING THE SAME

(71) Applicant: EverDisplay Optronics (Shanghai) Limited, Shanghai (CN)

(72) Inventors: Qiguo Zhang, Shanghai (CN); Chengpei Huang, Shanghai (CN); Chuwan Huang, Shanghai (CN)

( * ) Notice: Subject to any disclaimer, the term of this patent is extended or adjusted under 35 U.S.C. 154(b) by 0 days.

(21) Appl. No.: 14/134,630

(22) Filed: Dec. 19, 2013

(65) Prior Publication Data
US 2015/0017749 A1 Jan. 15, 2015

(30) Foreign Application Priority Data
Jul. 4, 2013 (CN) .......................... 2013 1 0280263

(51) Int. Cl.
H01L 51/52 (2006.01)
(52) U.S. Cl.
CPC ........ H01L 51/5256 (2013.01); H01L 51/5243 (2013.01); *Y10T 156/10* (2015.01); *Y10T 428/24942* (2015.01)
(58) Field of Classification Search
USPC ............................................ 438/26; 428/212
See application file for complete search history.

(56) References Cited

U.S. PATENT DOCUMENTS

| | | | | |
|---|---|---|---|---|
| 4,957,820 A | * | 9/1990 | Heyes et al. | 428/623 |
| 2011/0144297 A1 | * | 6/2011 | Dennes et al. | 528/183 |
| 2011/0315977 A1 | | 12/2011 | Murayama et al. | |

FOREIGN PATENT DOCUMENTS

| | | |
|---|---|---|
| CN | 2541364 Y | 3/2003 |
| CN | 101218692 A | 7/2008 |
| CN | 101517473 A | 8/2009 |
| CN | 101937974 A | 1/2011 |
| CN | 101941965 A | 1/2011 |
| CN | 1026405564 A | 8/2012 |
| TW | 379513 B | 1/2000 |
| TW | 493290 B | 1/2000 |
| TW | 200730973 A | 8/2007 |

OTHER PUBLICATIONS

Office Action issued May 18, 2015 by the CN Office.
Office Action issued Aug. 6, 2015 by the TW Office.

* cited by examiner

*Primary Examiner* — Mamadou Diallo
(74) *Attorney, Agent, or Firm* — Yunling Ren; Eaton & Van Winkle

(57) ABSTRACT

Provided herein is a flexible packaging substrate, comprising a first polymer layer; a metal foil layer disposed on the first polymer layer; a second polymer layer disposed on the metal foil layer; and wherein the surface area of the metal foil layer is larger than those of both the first and the second polymer layer. Also provided are a fabricating method for the same and a method for packaging an organic electroluminescent device using the same. The flexible packaging substrate according to the present invention is able to prevent oxygen and moisture from permeating effectively, allowing the service life of the packaged device prolonged. Additionally, the fabrication according to the examples of the present invention was performed through simple processes, and thereby the packaging process was simplified and the packaging performance was improved.

19 Claims, 1 Drawing Sheet

FLEXIBLE PACKAGING SUBSTRATE AND FABRICATING METHOD THEREOF AND PACKAGING METHOD FOR OLED USING THE SAME

CROSS-REFERENCE TO RELATED APPLICATIONS

This application claims the benefit of Chinese Patent Application No. 201310280263.8, filed on Jul. 4, 2013 and entitled "FLEXIBLE PACKAGING SUBSTRATE AND FABRICATING METHOD THEREOF AND PACKAGING METHOD FOR OLED USING THE SAME", the content of which is incorporated by reference herein in its entirety.

TECHNICAL FIELD

The present invention relates to the field of display, particularly to a flexible packaging substrate and a method for fabricating the same, as well as a method for packaging OLED using said flexible packaging substrate.

BACKGROUND

In recent years, organic electroluminescent display has emerged as the most potential display device, due to its outstanding advantages, such as all-solid configure, self-luminous mechanism, dispensing with backlight, low driving voltage, high efficiency, minimized thickness and flexibility performance. Generally, an organic electroluminescent device can be fabricated using a flexible substrate so as to achieve a flexible, light and portable final product. As well known, the electrode and luminescent materials of an organic electroluminescent device are very sensitive to oxygen and moisture, so the presence of oxygen and moisture in the device may be a major cause of shortened service life. Therefore, it is very important to employ a suitable packaging substrate and an effective packaging method to protect an organic electroluminescent device from environment effects and improve its efficiency and life.

Conventionally, the organic electroluminescent device is constructed on a hard glass substrate, which possesses a low oxygen and moisture permeability, capable of protecting the device effectively. A majority of the flexible substrates used in flexible organic electroluminescent devices are made from polymer materials, such as PC (polycarbonate), PET (polyethylene terephthalate), PEN (polyethylene naphthalate), PES (polyether sulphone), PI (polyimide). The polymer substrate features lightness, thinness, durability and flexibility. However, the polymer substrate has relatively large oxygen and moisture permeability, due to its smaller fractional free volume and larger chain segment average degree of freedom, so that it can not effectively prevent oxygen and moisture permeating into the device, leading to the service life shortened. To solve the permeation issue of the polymer substrate, one way commonly used is to form a barrier layer on the polymer substrate to prevent the permeating of oxygen and moisture. For example, Korean Patent Registration No. 0300425 discloses a polymer sheet used for an organic electroluminescent device, which comprises a plurality of barrier layers disposed thereon, WO02/065558 discloses a transparent organic silicon protective layer disposed on a transparent polymer sheet, and WO02/091064 discloses multi-blocking layers including organic layers and inorganic layers. Although one or more barrier layers formed on the polymer substrate can effectively prevent oxygen and moisture from entering, several depositing steps must be performed, which causes the process complicated and the optical and mechanical properties of the organic electroluminescent device negatively affected. Especially, when the barrier layers include inorganic layers, the inorganic layers with low flexibility can not facilitate the mechanical stress to be diffused, and therefore have a possibility of cracking, which may induce the oxygen and moisture permeating through cracks.

A sheet of metal foil has an excellent flexibility when its thickness is low to 100 μm or below. Compared with polymers, metal foils have better heat resistance and lower coefficient of thermal expansion, and particularly do not involve the oxygen and moisture permeating issue. Thus, a sheet of metal foil can be suitably used as a substrate for the flexible organic electroluminescent device. However, there is still a problem of higher electrical conductivity and larger surface roughness associated with the metal foil when using as the flexible substrate.

Besides oxygen and moisture permeating through the substrate from bottom, permeating from the periphery of the device also should be avoided. Currently, the periphery is generally packaged by sintering frit coated thereon via laser. However, frit will indurate and have no flexibility after sintering, and thereby is not applicable to a flexible displaying device.

Thus, there is still a demand for improved flexible packaging substrate and method, to protect both the bottom and the periphery of flexible organic electroluminescent device and ensure the device possesses both excellent flexibility and minimized oxygen and moisture permeability.

SUMMARY OF THE INVENTION

The present invention has been made in view of the prior art described hereinabove. It is therefore an object of the invention to provide a flexible packaging substrate, comprising:
  a first polymer layer;
  a metal foil layer disposed on the first polymer layer; and
  a second polymer layer disposed on the metal foil layer;
  wherein a surface area of the metal foil layer is larger than that of the first polymer layer and that of the second polymer layer.

According to some embodiments, the metal foil is aluminum or copper foil.

According to some embodiments, the metal foil has a thickness of 3 μm to 100 μm.

According to some embodiments, the first polymer layer and the second polymer layer are independently made from polyimide, polycarbonate, polyethylene glycol terephthalate, polyethylene naphthalate or polyether sulphone.

According to some embodiments, each of the first polymer layer and the second polymer layer is made from polyimide.

According to some embodiments, each of the first polymer layer and the second polymer layer has a thickness of 10 μm to 300 μm.

According to some embodiments, the first polymer layer and the second polymer layer respectively contain inorganic particles, which are selected from the group consisting of silica particles, silicon carbide particles, silicon nitride particles and alumina particles.

According to some embodiments, the flexible packaging substrate has a moisture permeability less than $1 \times 10^{-5}$ g/m²/d and an oxygen permeability less than $3 \times 10^{-4}$ cc/m²/d.

Another object of the present invention is to provide a flexible packaging substrate fabricating method, comprising the steps of:

(1) providing a sheet of metal foil;

(2) forming a first polymer layer on one surface of the metal foil, wherein a surface area of the first polymer layer is smaller than that of the metal foil; and (3) forming a second polymer layer on the other surface of the metal foil, wherein a surface area of the second polymer layer is smaller than that of the metal foil.

According to some embodiments, the metal foil is aluminum or copper foil.

According to some embodiments, the metal foil has a thickness of 3 μm to 100 μm.

According to some embodiments, each of the first polymer layer and the second polymer layer is a polyimide layer, which is formed on the surface of the metal foil layer by coating the precursor solution of polyimide and then curing through heating, or formed by adhering a polyimide sheet.

According to some embodiments, the precursor solution of polyimide also contains a surface modification agent and/or inorganic particles, which are selected from the group consisting of silica particles, silicon carbide particles, silicon nitride particles and alumina particles.

According to some embodiments, the curing is carried out by heating at a temperature of 50-80° C. for 30-60 min to realize the pre-imidization and then heating at a temperature of 120-150° C. for 30-80 min to realize the imidization.

According to some embodiments, each of the first polymer layer and the second polymer layer is made from polycarbonate, polyethylene glycol terephthalate, polyethylene naphthalate or polyether sulphone, and adhered to the surface of the metal foil layer.

According to some embodiments, each of the first polymer layer and the second polymer layer has a thickness of 10 μm to 300 μm.

Still another object of the present invention is to provide a method for packaging an organic electroluminescent device using the flexible packaging substrate as described above, comprises the steps of:

(1) forming an organic electroluminescent device on the second polymer layer of the flexible packaging substrate; and (2) coating organic binder on part of the metal foil layer of the flexible packaging substrate not being covered by the first polymer layer and the second polymer layer, and folding upward the part coated with organic binder and then adhering the part to the sides of the organic electroluminescent device.

According to some embodiments, the organic binder is organic silica gel.

The flexible packaging substrate according to the present invention has a polymer-metal foil multiple structure, which can provide the device packaged with excellent flexibility due to the flexible polymer and metal foil. Further, the metal foil can offer the flexible packaging substrate low moisture and oxygen permeability, such as a moisture permeability less than $1\times10^{-5}$ g/m$^2$/d and an oxygen permeability less than $3\times10^{-4}$ cc/m$^2$/d, so that the negative environment effects on the device packaged can be significantly reduced and thereby the service life of the device can be prolonged. Moreover, the polymer layers arranged on the surface of the metal foil can improve the insulation and the surface roughness of the substrate. According to the present invention, since the surface area of the metal foil is larger than those of the first and the second polymer layer, the part of the metal foil that extends beyond the polymer layers can be folded upward and adhered to the sides of the device through organic binder, to protect the periphery as well as the bottom of the device. Additionally, according to the fabricating method and the packaging method of the present invention, the need to repeatedly deposit a plurality of laminated barrier layers can be eliminated, and the metal foil is inexpensive and can be subjected to the continuous rolling process, leading to the process simplified and the cost lowered.

BRIEF DESCRIPTION OF THE DRAWINGS

These and other aspects, features, and advantages will be apparent from the following detailed description, taken in conjunction with the accompanying drawings, and in which.

DETAILED DESCRIPTION

Figure 1:
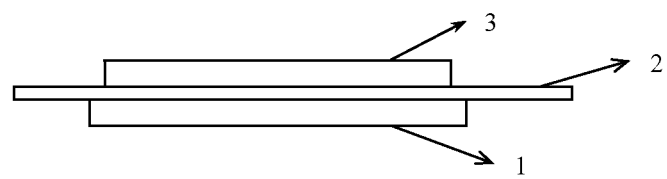
FIG. 1 is a schematic cross sectional illustration of the flexible packaging substrate according to the present invention.

Hereinafter, a flexible packaging substrate according to the present invention will be described with reference to FIG. 1. As shown, the flexible packaging substrate comprises a first polymer layer 1, a metal foil layer 2 disposed on the first polymer layer 1, a second polymer layer 3 disposed on the metal foil layer 2, wherein the surface area of the metal foil layer is larger than those of the first and the second polymer layer.

According to the present invention, the metal foil used in the flexible packaging substrate can be any one of the metal materials with good ductility and flexibility, and preferably be aluminium or copper, due to their outstanding capability to prevent oxygen and moisture permeating into the device to be packaged. Since the metal foil can exhibit excellent flexibility only when it is thin enough to reach 100 μm or below, taking into consideration the requirements of flexibility and mechanical strength in combination, the metal foil in the flexible packaging substrate according to the present invention preferably has a thickness of 3 to 100 μm.

When the metal foil is directly used as the substrate of the flexible displaying device, the protrusions on the rough surface of the metal foil may affect the electro-optical properties of the device. Long time should be taken and the uniformity is hard to control, when a large area of metal foil is polished by the traditional mechanical grinding process. According to the present invention, the flexible packaging substrate comprises the polymer layers on both sides of the metal foil, which assure that the substrate has a smooth surface, so that negative effects of the metal foil with rough surface on the efficiency and service life can be significantly decreased. Further, the polymer layers covering the conductive metal foil also serve as the insulating layers. The suitable polymer materials include polyimide, polycarbonate, polyethylene glycol terephthalate, polyethylene naphthalate, polyether sulphone and any other polymer substrate materials known in the art that can be used in organic electroluminescent devices. Polyimide is preferably used and the thickness of the first and the second polymer layer is preferably 10 to 300 μm.

Due to the metal foil layer with good capability to prevent oxygen and moisture entering, the flexible packaging substrate according to the present invention has a lowered moisture permeability less than $1\times10^{-5}$ g/m$^2$/d and an lowered oxygen permeability less than $3\times10^{-4}$ cc/m$^2$/d, which can facilitate the device to aging slowly and prolong the service life.

Also provided herein is a fabricating method for the flexible packaging substrate, comprising providing a sheet of metal foil; forming a first polymer layer on one surface of the metal foil, wherein the surface area of the first polymer layer is smaller than that of the metal foil; and forming a second polymer layer on the other surface of the metal foil, wherein the surface area of the second polymer layer is smaller than that of the metal foil. As described above, the suitable polymer materials include polyimide, polycarbonate, polyethylene glycol terephthalate, polyethylene naphthalate, polyether sulphone and any other polymer substrate materials known in the art that can be used in organic electroluminescent devices, and Polyimide is preferably used. In one embodiment, the polyimide sheets used for the polymer layers are adhered to both sides of the metal foil through organic binder, and the silica gel is preferably used as the binder. In another embodiment, the precursor solution of polyimide is coated on the surface of the metal foil, and then is heated at certain temperature for a period to cure and form a polyimide layer. Preferably, the curing is carried out by heating at a temperature of 50-80° C. for 30-60 min to realize the pre-imidization and then heating at a temperature of 120-150° C. for 30-80 min to realize the imidization. In still another embodiment, the precursor solution of polyimide also contains a surface modification agent and/or inorganic particles, to improve the film forming and insulating properties. The surface modification agent is not specifically limited in the present invention, and the inorganic particles are preferably silica particles, silicon carbide particles, silicon nitride particles or alumina particles. The polyimide layer formed by coating as described above can well combine with the metal foil. In other embodiments, other polymer substrate materials commonly used in organic electroluminescent devices, such as polycarbonate, polyethylene glycol terephthalate, polyethylene naphthalate or polyether sulphone, can be used and adhered to the metal foil to form the polymer layers.

Figure 2:
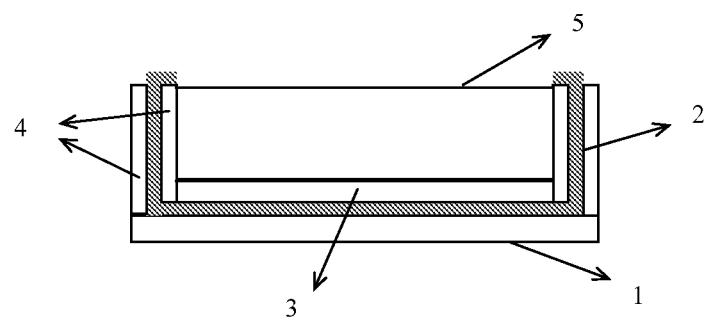
FIG. 2 is a schematic cross sectional illustration of an organic electroluminescent device packaged using the flexible packaging substrate of the present invention by the packaging method according to the present invention.

The present invention further provides a packaging method for organic electroluminescent devices using the flexible packaging substrate described above, comprising forming an organic electroluminescent device on the second polymer layer of the flexible packaging substrate; and coating organic binder on part of the metal foil layer of the flexible packaging substrate not being covered by the first polymer layer and the second polymer layer, and folding upward the part coated with organic binder and then adhering the part to the sides of the organic electroluminescent device. According to the packaging method of the present invention, an organic electroluminescent device as shown in FIG. 2 can be produced. Since the surface area of the metal foil 2 is larger that that of the first polymer layer 1and the second polymer layer 2, the metal foil 2 has the part not being covered by the polymer layers, in other word, the part extending beyond the polymer layers, which is coated with organic binder 4, preferably organic silica gel, and then folded upwards to adhere to the sides of the organic electroluminescent device 5 formed on the substrate. Therefore, according to the present invention, both the bottom and the periphery of the organic electroluminescent device can be protected by the flexible packaging substrate from the oxygen and moisture permeating. Additionally, compared with the hard frit used to packaging the periphery in the prior art, the flexible metal foil adhered to the sides can assure the flexibility of the whole device.

It will be appreciated by persons those skilled in the art that, although three-layer structure composed of one polymer layer, metal foil layer and the other polymer layer has been illustrated in detail according to some embodiments, the present invention is not limited hereby. Within the spirit and scope of the present invention, multiple such three-layer structures can be stacked together to form a multiple-layer structure flexible packaging substrate as needed and use, and a further improved protection effect can be achieved accordingly.

It will also be appreciated by persons those skilled in the art that, the flexible packaging substrate according to the present invention is not limited to the use in organic electroluminescent devices, and also can be used in other organic or inorganic photoelectric devices requiring excellent flexibility and protection from oxygen and moisture permeating, such as organic optical detectors, organic thin film transistors, organic photovoltaic cells, organic memories or organic integrated circuits.

The terms used herein each have usual means appreciated by the skilled person in the art, except otherwise indicated.

The present invention will be described in more detail with reference to the examples. It should be understood that the examples are provided for illustrating rather than limiting the present application.

EXAMPLES

Example 1

4,4'-diaminodiphenyl ether was dissolved in dimethylacetamide at 10° C. under $N_2$ atmosphere. Pyromellitic dianhydride was added gradually with stirring, until the mole ratio of Pyromellitic dianhydride to 4,4'-diaminodiphenyl ether reached 1:1, obtaining pale yellow transparent solution of poly(amic acid), which was the precursor solution of polyimide.

The solution of poly(amic acid) was coated on one side of 10 μm-thick aluminium or copper foil at a speed of 100 r/min by an improved low-speed spinning coating machine. Next, a curing process was carried out in an oven at 80° C. for 60 min to realize preimidization. Then, the temperature was raised to 150° C. and held for 80 min to facilitate the imidization. Finally, the first polyimide layer with a thickness of 20 μm was formed.

According to the same process as described regarding to the first polyimide layer, the second polyimide layer with a thickness of 20 μm was form on the other side of the foil. The fabrication of the flexible packaging substrate according to this example was completed.

The oxygen permeability and the moisture permeability of the resulted flexible packaging substrate were tested, respectively, and the results showed that the substrate had an improved capability to prevent oxygen and moisture from entering with a moisture permeability of $5 \times 10^{-6}$ $g/m^2/d$ and an oxygen permeability of $3 \times 10^{-4}$ $cc/m^2/d$.

Example 2

A 120 μm-thick polyimide sheet was directly adhered to both sides of a 20 μm-thick aluminium foil via organic silica gel, obtaining the flexible packaging substrate according to this example.

The oxygen permeability and the moisture permeability of the resulted flexible packaging substrate were tested, respectively, and the results showed that the substrate had an improved capability to prevent oxygen and moisture from entering with a moisture permeability of $1 \times 10^{-6}$ $g/m^2/d$ and an oxygen permeability of $1 \times 10^{-4}$ $cc/m^2/d$.

As a result, each of the flexible packaging substrates, fabricated according to Example 1 and Example 2 respectively, was able to prevent oxygen and moisture from permeating effectively, allowing the service life of the packaged device prolonged. Additionally, the fabrication according to the examples of the present invention was performed through simple processes, and thereby the packaging process was simplified and the packaging performance was improved.

What is claimed is:

1. A flexible packaging substrate of an OLED display, comprising
   a first polymer layer;
   a metal foil layer disposed on the first polymer layer; and
   a second polymer layer disposed on the metal foil layer;
   wherein a surface area of the metal foil layer is larger than that of the first polymer layer and that of the second polymer layer.

2. The flexible packaging substrate according to claim 1, wherein the metal foil is aluminum or copper foil.

3. The flexible packaging substrate according to claim 1, wherein the metal foil has a thickness of 3 μm to 100 μm.

4. The flexible packaging substrate according to claim 1, wherein the first polymer layer and the second polymer layer are independently made from polyimide, polycarbonate, polyethylene glycol terephthalate, polyethylene naphthalate or polyether sulphone.

5. The flexible packaging substrate according to claim 4, wherein each of the first polymer layer and the second polymer layer is made from polyimide.

6. The flexible packaging substrate according to claim 1, wherein each of the first polymer layer and the second polymer layer has a thickness of 10 μm to 300 μm.

7. The flexible packaging substrate according to claim 1, wherein the first polymer layer and the second polymer layer respectively contain inorganic particles, which are selected from the group consisting of silica particles, silicon carbide particles, silicon nitride particles and alumina particles.

8. The flexible packaging substrate according to claim 1 having a moisture permeability less than $1 \times 10^{-5}$ g/m$^2$/d and an oxygen permeability less than $3 \times 10^{-4}$ cc/m$^2$/d.

9. A flexible packaging substrate fabricating method for an OLED display, comprising the steps of:
   (1) providing a sheet of metal foil;
   (2) forming a first polymer layer on one surface of the metal foil, wherein a surface area of the first polymer layer is smaller than that of the metal foil; and
   (3) forming a second polymer layer on the other surface of the metal foil, wherein a surface area of the second polymer layer is smaller than that of the metal foil.

10. The method according to claim 9, wherein the metal foil has a thickness of 3 μm to 100 μm.

11. The method according to claim 9, wherein each of the first polymer layer and the second polymer layer is a polyimide layer, which is formed on the surface of the metal foil layer by coating the precursor solution of polyimide and then curing through heating, or formed by adhering a polyimide sheet through an organic binder.

12. The method according to claim 11, wherein the precursor solution of polyimide is poly (amic acide) solution.

13. The method according to claim 11, wherein the curing is carried out by heating at a temperature of 50-80° C. for 30-60 min to realize the pre-imidization and then heating at a temperature of 120-150° C. for 30-80 min to realize the imidization.

14. The method according to claim 11, wherein the organic binder is organic silica gel.

15. The method according to claim 9, wherein each of the first polymer layer and the second polymer layer is made from polycarbonate, polyethylene glycol terephthalate, polyethylene naphthalate or polyether sulphone, and adhered to the surface of the metal foil layer through an organic binder.

16. The method according to claim 15, wherein the organic binder is organic silica gel.

17. The method according to claim 9, wherein each of the first polymer layer and the second polymer layer has a thickness of 10 μm to 300 μm.

18. A method for packaging an organic electroluminescent device using the flexible packaging substrate according to claim 1, comprising the steps of:
   (1) forming an organic electroluminescent device on the second polymer layer of the flexible packaging substrate; and
   (2) coating organic binder on part of the metal foil layer of the flexible packaging substrate not being covered by the first polymer layer and the second polymer layer, and folding upward the part coated with organic binder and then adhering the part to the sides of the organic electroluminescent device.

19. The method according to claim 18, wherein the organic binder is organic silica gel.

* * * * *